US006169395B1

United States Patent
King

(10) Patent No.: US 6,169,395 B1
(45) Date of Patent: Jan. 2, 2001

(54) TEST FOR DETERMINING POLARITY OF ELECTROLYTIC CAPACITORS WITHIN ELECTRONIC ASSEMBLIES

(75) Inventor: Philip N. King, Fort Collins, CO (US)

(73) Assignee: Agilent Technologies, Palo Alto, CA (US)

(*) Notice: Under 35 U.S.C. 154(b), the term of this patent shall be extended for 0 days.

(21) Appl. No.: 08/903,321

(22) Filed: Jul. 16, 1997

Related U.S. Application Data

(63) Continuation of application No. 08/372,619, filed on Jan. 11, 1995, now abandoned.

(51) Int. Cl.[7] .............................. G01R 29/08; G01R 19/14

(52) U.S. Cl. ................................ 324/133; 324/548

(58) Field of Search ............................ 324/524, 537, 324/548, 687, 688, 133

(56) References Cited

U.S. PATENT DOCUMENTS

| | | | |
|---|---|---|---|
| 4,745,359 | 5/1988 | Leitz | 324/133 |
| 4,779,040 | * 10/1988 | Aldinger | 324/678 |
| 5,159,526 | 10/1992 | Marek | 361/301 |
| 5,450,014 | * 9/1995 | Lee | 324/548 |
| 5,502,375 | * 3/1996 | Marek | 324/133 |
| 5,504,422 | * 4/1996 | Bundschuh et al. | 324/133 |

FOREIGN PATENT DOCUMENTS

0185255 A1   6/1986  (EP) ......................................... 31/2

* cited by examiner

Primary Examiner—Glenn W. Brown
(74) Attorney, Agent, or Firm—Augustus W. Winfield

(57) ABSTRACT

A method of determining whether an electrolytic capacitor is properly connected or reversed in an electronic assembly. In a first embodiment, a non-contacting probe is placed near but not touching the body of the device under test (DUT). One terminal of the DUT is driven by a stimulus (voltage source or current source) while the other terminal is connected to a reference voltage. A voltage is measured at the probe relative to the reference voltage and the device is properly oriented if the measured voltage exceeds a predetermined threshold. In a second embodiment, current through the probe is measured instead of voltage at the probe. In a third embodiment, a non-contacting probe is placed near but not touching both leads of the DUT. Each DUT lead is alternately driven by a stimulus and alternately connected to a reference voltage. For each of the two lead test configurations, a voltage at each DUT lead is measured and current through the non-contacting probe is measured. Two algebraic electromagnetic coupling coefficients are computed from the four voltage measurements and the two current measurements. The relative size of the electromagnetic coupling coefficients determines the measured polarity of the DUT. An alternative configuration for any of the embodiments is to drive the probe instead of a terminal of the DUT.

11 Claims, 9 Drawing Sheets

TEST FOR DETERMINING POLARITY OF ELECTROLYTIC CAPACITORS WITHIN ELECTRONIC ASSEMBLIES

This application is a Continuation of Ser. No. 08/372,619 filed Jan. 11, 1995 now abandoned.

FIELD OF INVENTION

This invention relates generally to testing of electronic assemblies and more specifically to testing to determine if polarized parts are installed with the correct polarity.

BACKGROUND OF THE INVENTION

There is an ongoing need in electronic manufacturing testing and failure testing to automatically determine whether polarized parts are attached with the proper electrical orientation. Electrolytic capacitors, diodes, integrated circuits and other devices are often mechanically symmetrical but electrically asymmetrical. That is, they can physically be attached or mounted with any of several orientations but only work properly when attached or mounted with one particular orientation. Electrolytic capacitors are a particular problem because they may function for some time when attached with the terminals reversed. As a result, they may pass typical conventional circuit tests at the time of manufacturing, but they may degrade in capacitance value over time, increase leakage current over time, or they may later fail catastrophically (explode). The need for detecting those devices that will degrade is important economically because repair before final assembly of a product is much less expensive than repair of a shipped product. For those devices that may explode, it is especially important from both a safety and cost perspective to determine installation polarity before full operating voltage is first applied. There is a need for automatic testing for capacitor polarity and in particular, there is need for automatic testing using equipment that is already in place for testing other parts of an electronic assembly.

Many commercially available testers for loaded printed circuit boards have two kinds of probes for providing electronic stimulus signals and for measuring electronic responses. Contacting probes make physical contact with conductive surfaces within the electronic assembly. Typically, a sharp pointed "nail" is used to penetrate a protective coating and to make contact with a trace or pad on a printed circuit board. Non-contacting probes induce or measure electromagnetic fields near the electronic devices being tested. For example, non-contacting capacitive probes are used to detect open solder joints on loaded printed circuit boards. An example of a commercially available printed circuit board tester using "bed-of-nails" fixtures and non-contacting probes is the Hewlett-Packard 3070 Series II Test System with HP TestJet non-contacting probes. An example of use of non-contact testing for integrated circuits may be found in U.S. Pat. No. 5,254,953 (Identification Of Pin-Open Faults By Capacitive Coupling Through The Integrated Circuit Package) issued Nov. 19, 1993 to David T. Crook and Kevin W. Keirn (Crook et al). There is a need for automatic testing of polarity of assembled electronic components using existing test probe hardware such as "bed-of-nails" probes and non-contacting probes.

SUMMARY OF THE INVENTION

Polarity of an electrolytic capacitor is determined by measuring electromagnetic coupling between the capacitor and a non-contacting probe. In one configuration, the device under test is actively stimulated and a response is detected by a noncontacting capacitive probe placed near the body of the device under test. Alternatively, instead of applying a stimulus to the leads of the device under test and making a measurement at the probe, the probe may be stimulated with measurements made at the leads of the device under test.

In a first embodiment, a single voltage measurement is made. In a second embodiment, a single current measurement is made. In a third embodiment, multiple voltage and current measurements are made under two different test configurations. In the third embodiment, two electromagnetic coupling coefficients are unknown fixed coefficients in two linear equations. The variable parameters in the two linear equations are the voltages at each of the terminals of the device under test and the current flowing through the capacitive probe. In the first configuration for the third embodiment, a first terminal of the device under test is stimulated and the second terminal is held at a reference voltage (or connected to a common signal return). In the second configuration of the third embodiment, the first terminal is held at the reference voltage (or connected to a common signal return) and the second terminal is stimulated. After measuring the four terminal voltages and the two probe currents, the two equations are solved for the two unknown electromagnetic coupling coefficients. The relative size of the electromagnetic coupling coefficients determines the measured polarity of the device under test.

DETAILED DESCRIPTION OF THE PREFERRED EMBODIMENT OF THE INVENTION

Figure 1A:
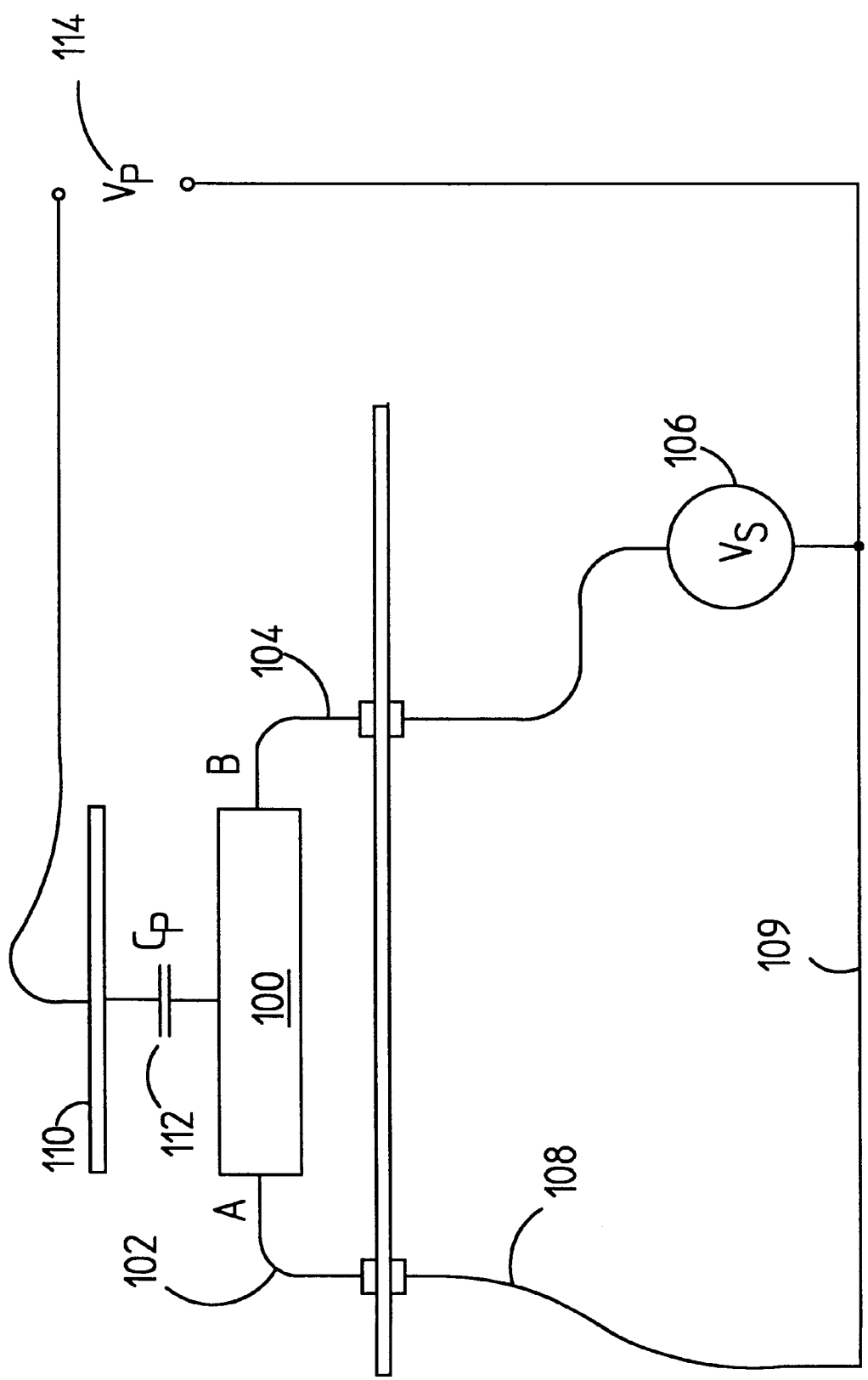
FIG. 1A is a side view and schematic of a circuit for detecting polarity of an axial electrolytic capacitor on a printed circuit board.

FIG. 1A illustrates a side view of an axial electrolytic capacitor 100 having two leads (102, 104) attached to a printed circuit board. Capacitor 100 is the device under test (DUT). The goal of the test is to determine whether leads 102 and 104 are connected properly or reversed. A non-contacting capacitive probe 110 (a conductive plate) is placed near but not electrically contacting the outer case of the capacitor 100. There is an effective capacitance $C_P$ (112) between the probe 110 and the outer case of the capacitor 100.

For purposes of illustration, assume that capacitor 100 has a conductive case, that lead 104 is connected to the case of the capacitor 100, and that the capacitor 100 is correctly installed when lead 104 is connected as illustrated. In addition, assume that lead 104 is being driven by an ideal voltage source 106, that capacitor lead 102 is connected to an ideal common signal return 109 by an ideal lead 108, and that a voltage $V_P$ (114) is measured on the capacitive probe by an ideal voltage measuring device. With ideal components and correct polarity, $V_P$ (114) is identical to voltage $V_S$ (106), being ideally coupled through capacitance 112 onto plate 110 from the conductive case of capacitor 100. In contrast, if the capacitor 100 is reversed, so that the case of capacitor 100 is connected to the common signal return 109 by lead 108, then the conductive case provides a Faraday shield around the capacitor lead connected to the voltage source 106 and no voltage is coupled to the plate 110. With this assumed ideal system, if $V_P$ (114) is equal to $V_S$ (106) then capacitor 100 is installed correctly and if $V_P$ (114) is zero then capacitor 100 is reversed.

$V_S$ (106) is an AC (sinusoidal) stimulus voltage. Suitable example values for $V_S$ (106) are 0.6 V peak-to-peak (to avoid turning on semiconductor devices that may also be present) at a frequency of approximately 1 KHz. In general, lower frequencies work better for larger parts (for example a few hundred Hertz) and higher frequencies (up to about 10 KHz) work better for small parts.

Figure 1B:
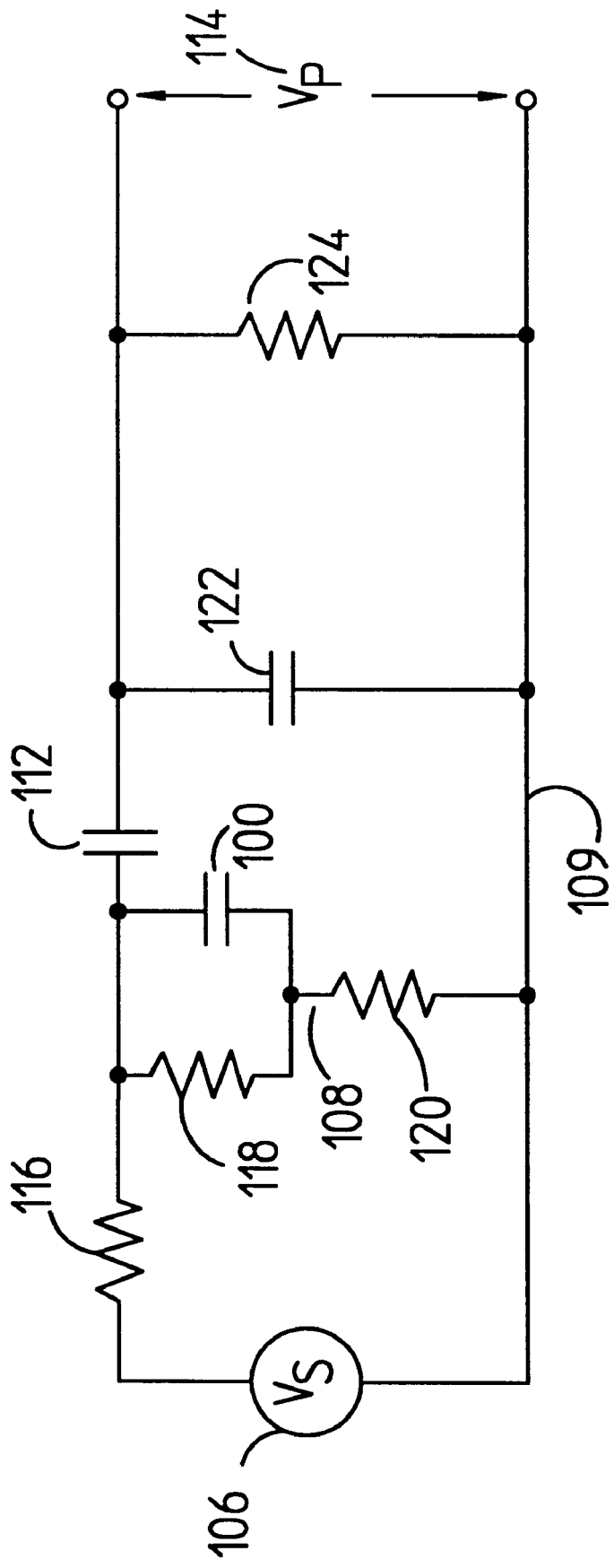
FIG. 1B is a schematic model of the system of FIG. 1A.

FIG. 1B is a model of the circuit of FIG. 1A with realistic components. In a typical board test system, the stimulus voltage 106 and lead 108 are connected through a "bed-of-nails" fixture or other temporary connection method. As illustrated in FIG. 1B, the stimulus voltage 106 in a realistic system has a finite source and interconnection impedance 116. The system in which capacitor 100 is installed has some finite parallel impedance 118. Lead 108 has a finite interconnection impedance 120. The voltage measuring device (and circuitry between probe 110 and the voltage measuring device) has a finite capacitance 122 and resistance 124. As a result of finite impedances (including the impedance of capacitor 100) on the stimulus side of FIG. 1B, the voltage at the case of capacitor 100 is a fraction of the stimulus voltage 106. As a result of impedances on the measuring side (122, 124), the voltage measured (114) is a fraction of the voltage at the case of the capacitor 100. Assuming the case of capacitor 100 is driven by the stimulus, the capacitor 100 is installed correctly if the voltage measured (114) exceeds some predetermined threshold value or exceeds some predetermined fraction of $V_S$ (106).

The voltage measurement $V_P$ (114) is inherently affected by capacitance 122. The contribution of the system to capacitance 122 can be substantial and the system contribution may be variable. For example, system stray capacitance may vary with relative humidity. Therefore, it is preferable to use a measurement that is not affected by system stray capacitance.

Figure 1C:
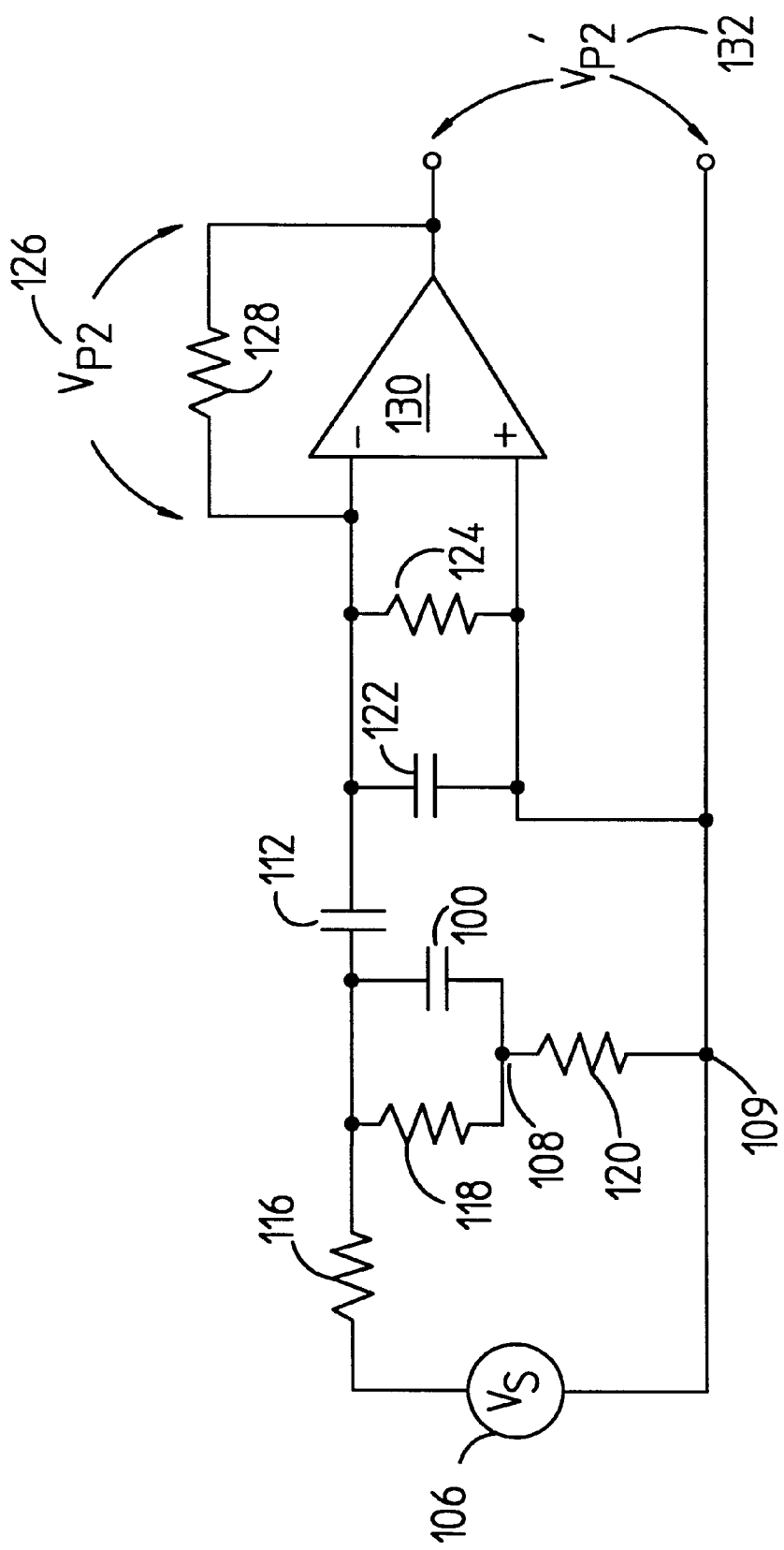
FIG. 1C is a schematic model of the system of FIG. 1A with an improved measurement circuit.

The system illustrated in FIG. 1C is an embodiment that reduces the effect of capacitive voltage division created by system capacitance 122 by using an operational amplifier as illustrated in FIG. 1C to measure current instead of voltage. The current through capacitance 112 is measured indirectly by the operational amplifier 130. When capacitor 100 is installed correctly, the conductive case of capacitor 100 couples a relatively large current through capacitance 112 and when capacitor 100 is reversed, the case of capacitor 100 shields the stimulus voltage so that a relatively small current flows through capacitance 112. Assuming the case of the capacitor 100 is driven by the stimulus, the capacitor 100 is installed correctly if the measured current exceeds a predetermined threshold value. The voltage across the stray capacitance 122 and the current though capacitance 122 are reduced to essentially zero because the voltage between the negative input of operational amplifier 130 and the positive input of operational amplifier 130 is very small (virtually zero).

In FIG. 1C, voltage $V_{P2}$ (126), measured across the feedback resistor 128 of the operational amplifier 130, is a direct measure of the current flowing through the feedback resistor and is an indirect measure of the current flowing through the capacitance 112. Alternatively, the current flowing through capacitance 112 may be indirectly measured from the voltage between the output of amplifier 130 and the common signal return 109. Note that if the voltage across the inputs to amplifier 130 is zero, then this alternative measurement (designated as $V'_{P2}$ (132) in FIG. 1C) is identical to $V_{P2}$ (126). $V'_{P2}$ (132) is an easier measurement to make in a typical board test system. Using an operational amplifier input to reduce the effects of external circuit impedances is a technique used in commercially available testers having capacitive probes for continuity testing (see, for example, Crook et al).

The embodiment of FIG. 1C is an improvement over the embodiment of FIG. 1B. However, there are still practical limitations. If the impedance of capacitor 100 is very small (capacitance large) relative to the source impedance 116 and the common return impedance 120, then the fraction of the stimulus voltage at the case of capacitor 100 may be so small that the measurement above becomes impractical. That is, the contribution of the stimulus voltage on the case of capacitor 100 to the voltage $V_P$ (114) cannot be directly and reliably distinguished from noise or from contribution from other possible coupling paths. This can be improved by lowering the stimulus frequency, thereby increasing the impedance of capacitor 100. However, as an empirical observation in a typical board test environment, the polarity test embodiments described above are best suited for capacitors smaller than 10 microfarads whereas capacitors much larger than 10 microfarads require a polarity test providing even better compensation for circuit impedances and alternate coupling paths, such the embodiment of FIGS. 2A and 2B as described below.

Figure 2A:
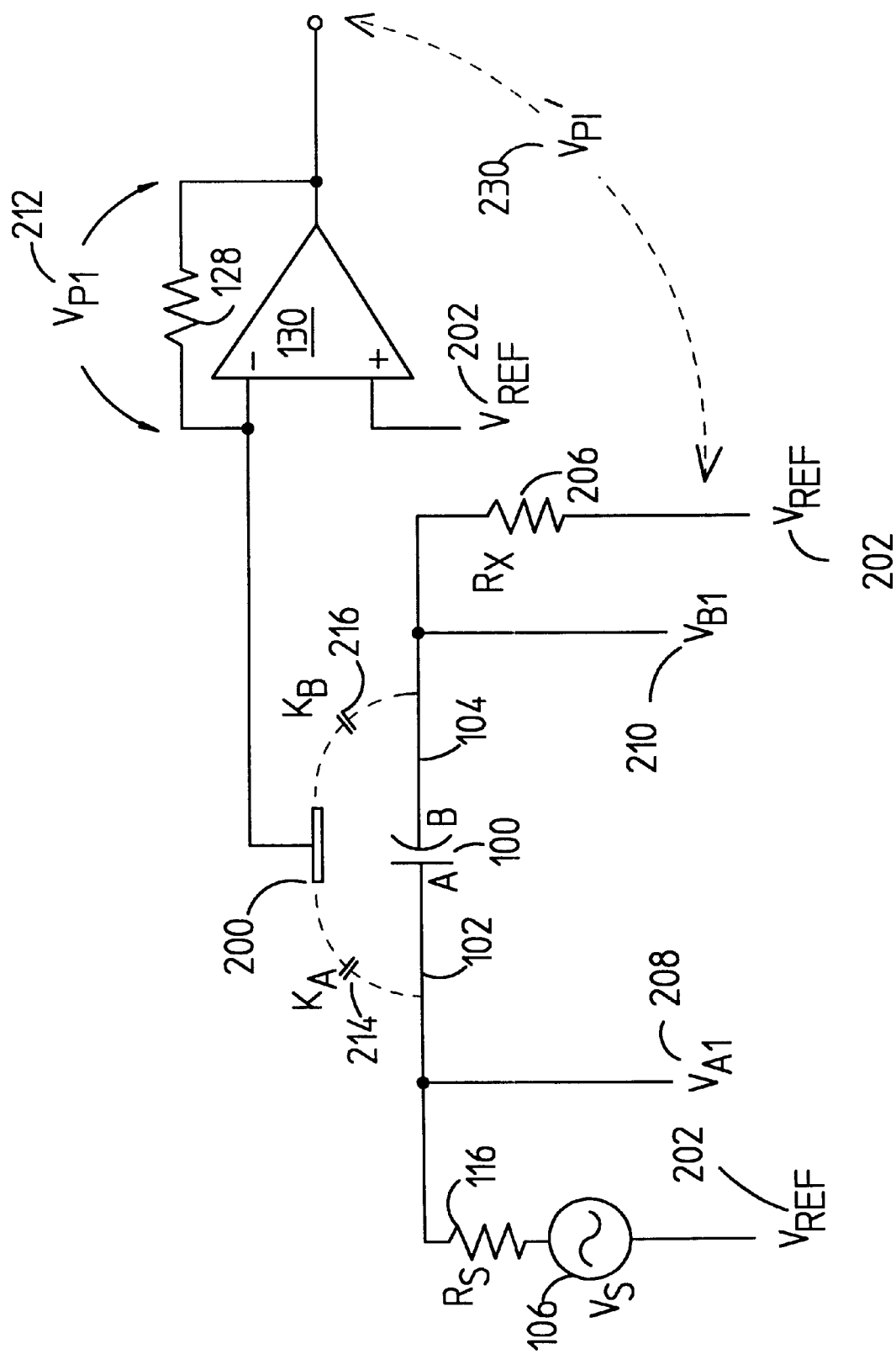
FIG. 2A is a schematic of a circuit for detecting polarity of a capacitor illustrating a device under test along with associated stimulus and response circuitry and definitions of variables for a first measurement.

FIG. 2A is a schematic of an arrangement similar to that of FIG. 1A except in FIG. 2A, the capacitive probe 200 is large enough to ensure some coupling to each of the leads of the device under test. Lead 102 in FIG. 1A is designated as terminal "A" in FIGS. 2A and 2B and values with an "A" subscript designate a stimulus or measurement associated with terminal "A." Lead 104 in FIG. 1A is designated terminal "B" in FIGS. 2A and 2B and values with a "B" subscript designate a stimulus or measurement associated with terminal "B." During testing, a first lead of the DUT is stimulated while the second lead is connected to $V_{REF}$ (202) (as illustrated in FIG. 2A) and then the second lead is stimulated while the first lead is connected to $V_{REF}$ (202) (as illustrated in FIG. 2B).

Figure 2B:
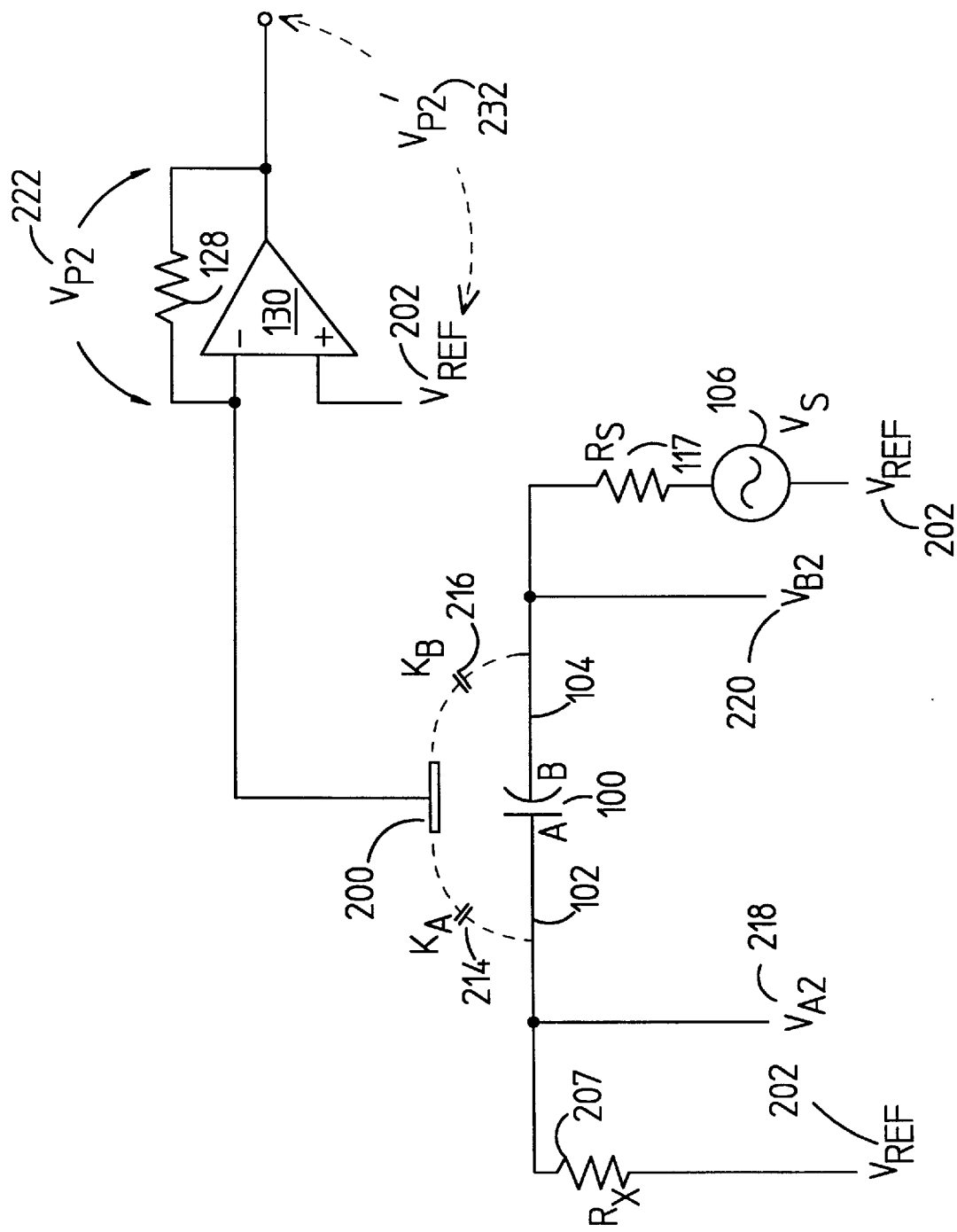
FIG. 2B is a schematic illustrating the device under test of FIG. 2A with definitions of variables for a second measurement.

Preferably, all voltage measurements in FIGS. 2A and 2B are made relative to a reference voltage $V_{REF}$ (202) but in general, may be made relative to other low-noise reference potentials having a known relationship to $V_{REF}$ (202). Note that $V_{REF}$ (202) may be at a ground potential or it may be a voltage other than ground. For example, if one terminal of the DUT is connected to a ground for the electronic assembly, the board test system may need to be isolated or floating at some voltage other than the electronic assembly ground. Note that in the board test field, ground voltages or reference voltages are sometimes referred to as guarding voltages.

$R_S$ (116) is the total source impedance of the stimulus 106 (comprising the inherent output source impedance of the stimulus combined with any interconnection impedance between the stimulus and the measurement points accessible on the DUT). As discussed above in conjunction with FIG. 1C, if the impedance of capacitor 100 is small relative to $R_S$ (116) then only a fraction of $V_S$ (106) appears at terminal 102 or terminal 104 of capacitor 100. In the embodiment illustrated in FIGS. 2A and 2B, the effects of source and measurement impedances are minimized by directly measuring the voltages at terminals 102 and 104. Voltage $V_{A1}$ (208) is measured at terminal "A" by a separate contacting probe physically close to terminal "A." Likewise, voltage $V_{B1}$ (210) is measured at terminal "B" by a separate contacting probe physically close to terminal "B." Separate wires allow the most accurate possible measurement of the voltages actually appearing on the leads of the DUT.

A third voltage measurement $V_{P1}$ (212) is made with capacitive probe 200. The measured voltage $V_{P1}$ (212) is the voltage across the feedback resistor 128 of the operational amplifier circuit 130 and is determined by the sum of the currents capacitively coupled through the probe 200 from the leads and body of the DUT. Alternatively, the third measurement may be measured from the output of amplifier 130 to $V_{REF}$ (202). As discussed in conjunction with FIG. 1C, this alternative measurement (designated as $V'_{P1}$ (230) in FIG. 2A and as $V'_{P2}$ (232) in FIG. 2B) is an easier measurement to make in a typical board test system.

Electromagnetic coupling is depicted in FIGS. 2A and 2B as two capacitors but it should be understood that $K_A$ (214) and $K_B$ (216) are not capacitance values but instead are dimensionless numbers (electromagnetic coupling coefficients) in an equation representing the contribution of a voltage at a DUT lead (and the conductive capacitor case attached to one of the leads) to a current flowing through the conductive plate and finally resulting in a measured voltage at the operational amplifier as defined by following equation:

$$K_A V_{A1} + K_B V_{B1} = V_{P1} \qquad \text{Equation 1}$$

Notice in equation 1 that $V_{A1}$, $V_{B1}$, and $V_{P1}$ are all measured values whereas the electromagnetic coupling coefficients $K_A$ and $K_B$ are both unknown. A second equation (and set of measurements) is required to determine the electromagnetic coupling coefficients $K_A$ and $K_B$. FIG. 2B illustrates a second set of measurements, with the stimulus $V_S$ (106) driving terminal "B" (104) of the DUT and terminal "A" (102) connected to the reference voltage (202). The voltage at terminal "A" ($V_{A2}$ (218)), the voltage at terminal "B" ($V_{B2}$ (220)) and the probe current (measured as $V_{P2}$ (222)) are measured a second time. The electromagnetic coupling coefficients $K_A$ and $K_B$ are unchanged because the capacitive probe 200 remains stationary for the two measurements. Note that the source impedances (116, 117) and interconnection impedances (206, 207) may not be identical for the two measurements. However, these impedances do not affect the equations for the electromagnetic coupling coefficients because the critical voltages are measured directly at the terminals of the DUT. The second set of measured voltages and the electromagnetic coupling coefficients are related by the following equation:

$$K_A V_{A2} + K_B V_{B2} = V_{P2} \qquad \text{Equation 2}$$

After the two sets of measurements, equation 1 and equation 2 are solved for the two unknown electromagnetic coupling coefficients $K_A$ and $K_B$. Note that the typical board test system is computer controlled (not illustrated) and the computer may be used to solve the well known problem of two linear equations with two unknowns as follows:

$$K_A = (V_{B1} V_{P2} - V_{B2} V_{P1})/(V_{B1} V_{A2} - V_{B2} V_{A1}) \qquad \text{Equation 3}$$

$$K_B = (V_{A1} V_{P2} - V_{A2} V_{P1})/(V_{A1} V_{B2} - V_{A2} V_{B1}) \qquad \text{Equation 4}$$

If, for example, terminal A (102) is connected to the conductive case, the magnitude of $K_A$ should be larger than the magnitude of $K_B$. If the magnitude of $K_A$ measures as being greater than the magnitude of $K_B$, the capacitor is installed correctly. If the magnitude of $K_A$ measures as being less than the magnitude of $K_B$, the capacitor is reversed. Note that the two step test described above properly accounts for circuit impedances (voltages are measured at the terminals of the DUT), properly accounts for alternate coupling paths to the non contacting probe ($K_A$ and $K_B$) and depends on voltage differences at two different stimulus conditions rather than a single absolute measurement. The two step polarity measurement is suitable for any size of capacitors and therefore has broader application than either of the single step measurements.

Figure 3:
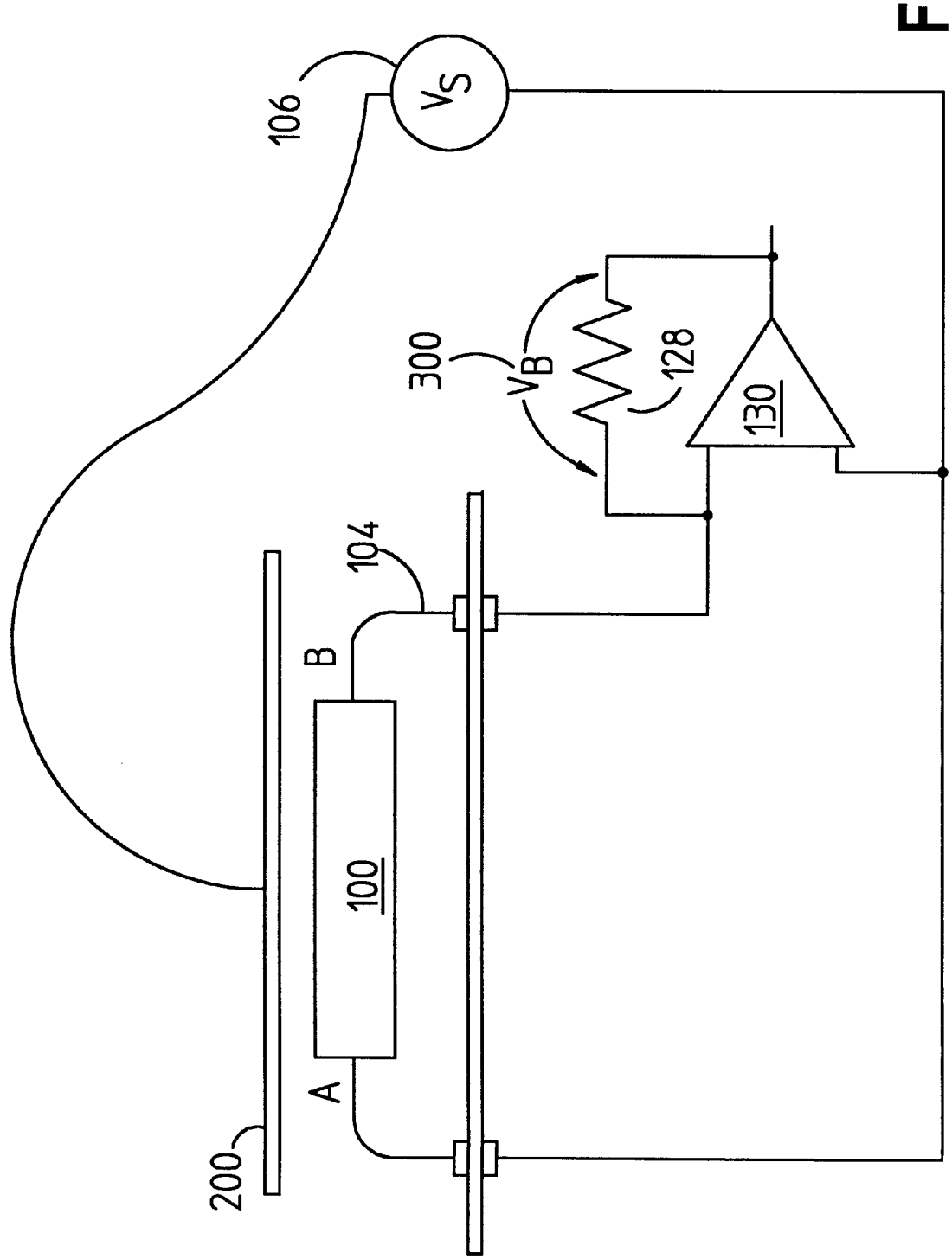
FIG. 3 is a side view and partial schematic of a capacitor polarity detection circuit illustrating an alternative test configuration in which the stimulus is connected to the probe.

The test configuration illustrated in FIGS. 1A–1C and 2A–2B may be reversed so that the stimulus drives the probe and the voltages at the capacitor leads are measured with alternate leads connected to the reference voltage. For example, in FIG. 3, voltage source 106 drives the probe 200 and in a first measurement, the current from lead B is measured with lead A connected to a common signal return (or reference voltage). In a second measurement, the current from lead A is measured with lead B connected to a common signal return (or reference voltage). In addition, it should be appreciated that the voltage stimulus 106 illustrated in FIGS. 1A–1C, FIGS. 2A–2B and FIG. 3 may be replaced by a Thevenin equivalent current source.

Figure 4:
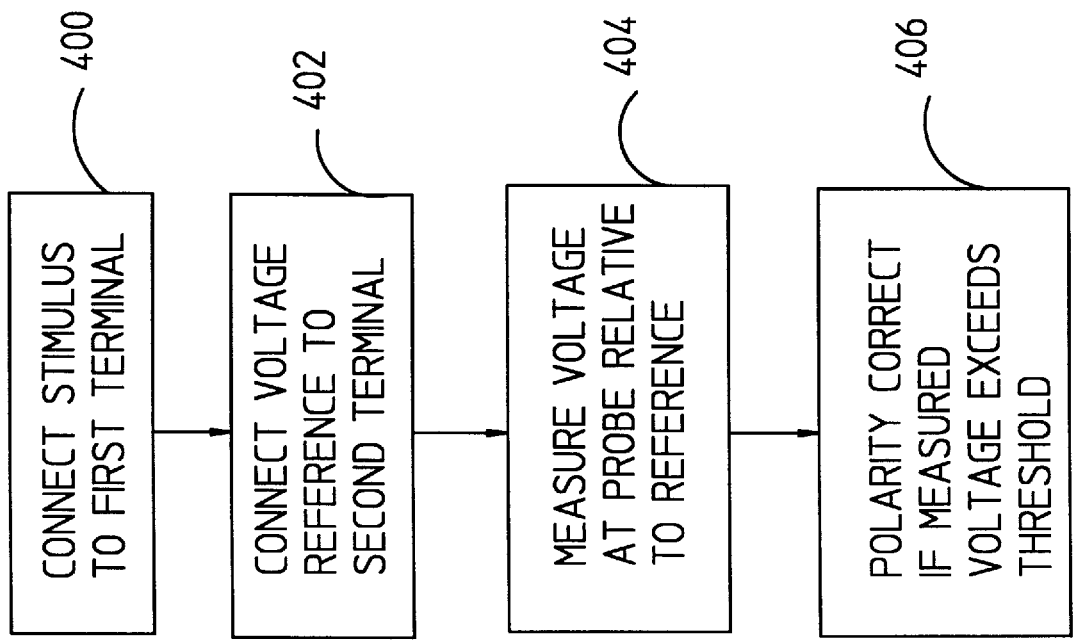
FIG. 4 is a flow chart of the method of one configuration of a first embodiment.
Figure 5:
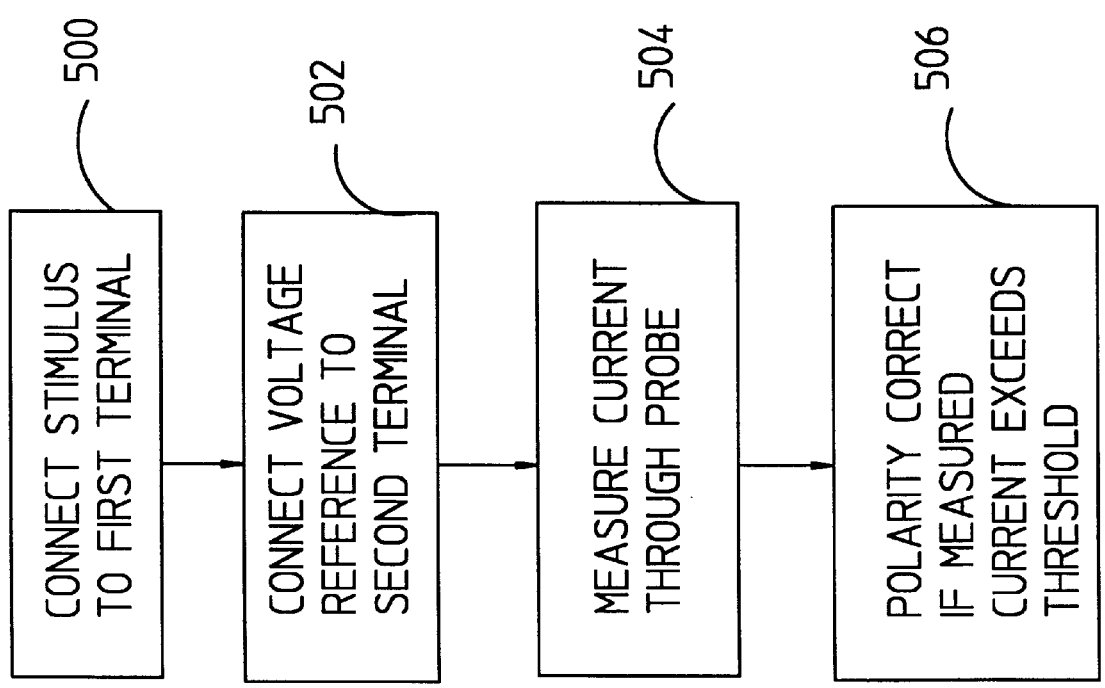
FIG. 5 is a flow chart of the method of one configuration of a second embodiment.
Figure 6:
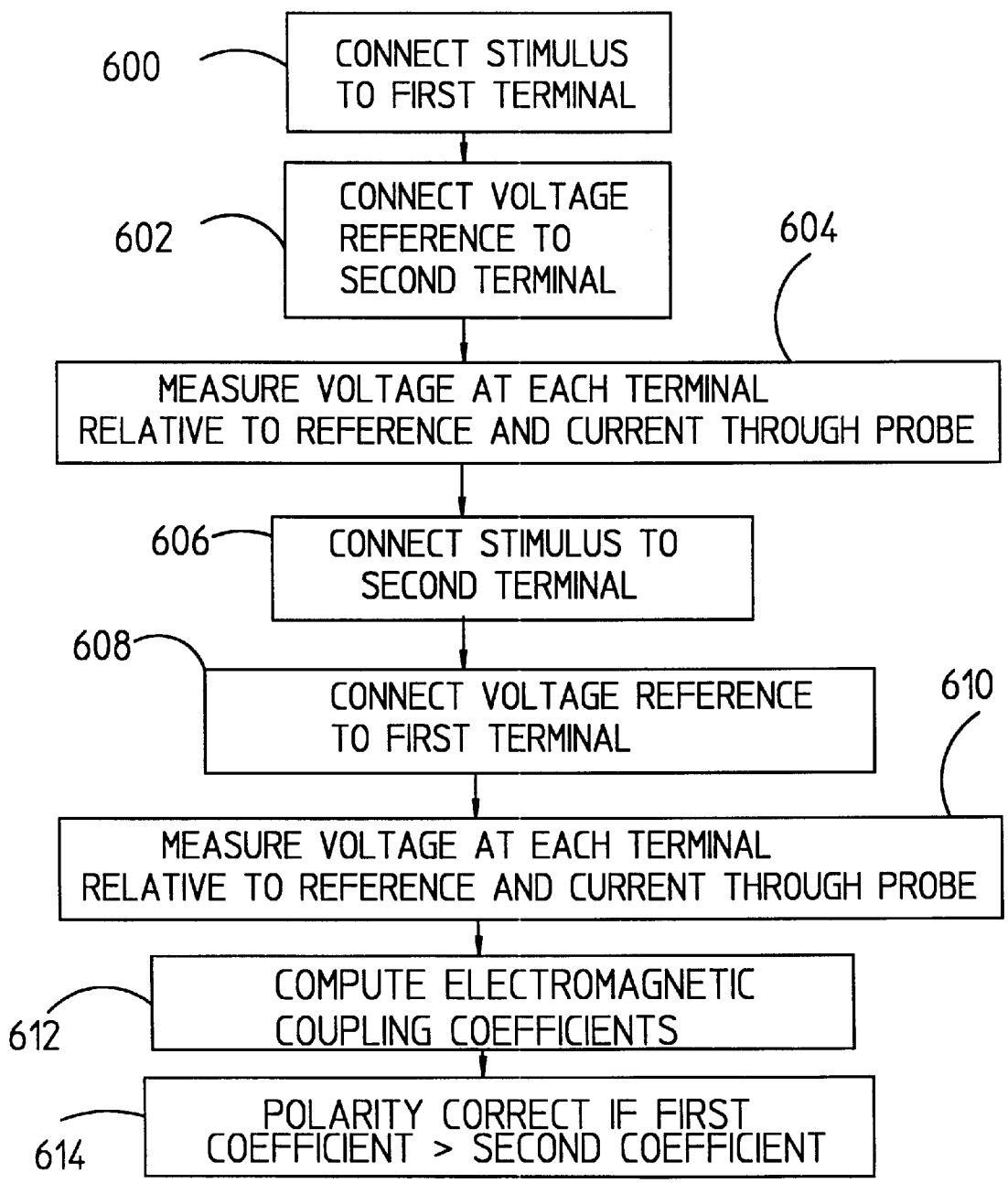
FIG. 6 is a flow chart of the method of one configuration of a third embodiment.

FIG. 4 is a flow chart illustrating one configuration (driving the DUT with the stimulus) for the first embodiment as discussed in conjunction with the circuit of FIG. 1B. FIG. 5 is a flow chart illustrating one configuration (driving the DUT with the stimulus) for the second embodiment as discussed in conjunction with the circuit of FIG. 1C. FIG. 6 is a flow chart illustrating one configuration (driving the DUT with the stimulus) for the third embodiment as discussed in conjunction with the circuits of FIGS. 2A and 2B.

Both the single step and two step polarity tests assume that the test system knows which lead of the DUT is attached to the case. This may vary from vendor to vendor so that in general, the expected polarity may have to be vendor and part number specific.

Capacitor 100 in FIG. 1A is specifically described as an axial capacitor. The tests described above are also suitable for some electrolytic radial capacitors. The general requirement is that one lead needs to be connected to a Faraday shield so that the electromagnetic coupling is asymmetrical. In particular, if one lead of a radial capacitor is attached to a conductive case, or if the construction is such that one lead consistently has a larger capacitive coupling to the case, then either the single step or two step tests described above are applicable. The probe 110 or 200 is placed near the conductive case. Since both leads are surrounded by the case in a radial device, there is little coupling from the leads but the coupling from the case alone provides a useful test.

In addition, for some capacitor types, the polarity tests described above are suitable even if one lead of the capacitor is not attached to a conductive case or even if the outer surface of the capacitor body is not conductive. For example, the polarity tests described above may be used for surface mount tantalum capacitors, even though surface mount tantalum capacitors technically may not have a separate conductive case. Surface mount tantalum capacitors typically have a porous metal exterior surrounding a solid electrolyte. The porous metal exterior typically provides sufficient asymmetrical coupling (Faraday shielding) to enable polarity testing as described above. In addition, if a capacitor is constructed by cylindrically wrapping layers of conductors and dielectric, then the outermost conductive layer provides the same asymmetrical coupling (Faraday shielding) as a conductive case. Therefore, if a particular capacitor construction always results in the same conductor as the outer conductive layer, the polarity tests described above may be used.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method for testing whether a capacitor in an electronic assembly is installed with a correct polarity, the capacitor being electrically stimulated by a time warming stimulus, the capacitor having first and second terminals, the method comprising the following steps:
   (a) placing a probe near the first and second terminals but not in electrical contact with the first and second terminals;
   (b) measuring a first electromagnetic coupling coefficient between the probe and the first terminal and a second electromagnetic coupling coefficient between the probe and the second terminal; and
   (c) determining that the capacitor polarity is correct if the magnitude of the first electromagnetic coupling coefficient is greater than the magnitude of the second electromagnetic coupling coefficient.

2. The method of claim 1, step (b) further comprising:
   (b1) driving the first terminal of the capacitor with a stimulus;
   (b2) connecting the second terminal of the capacitor to a reference voltage;
   (b3) making the following measurements while the first terminal is being driven by the stimulus and while the second terminal is connected to the reference voltage;
      (b3a) measuring a first voltage at the first terminal of the capacitor;
      (b3b) measuring a second voltage at the second terminal of the capacitor;
      (b3c) measuring a first current through the probe;
   (b4) driving the second terminal of the capacitor with the stimulus;
   (b5) connecting the first terminal of the capacitor to the reference voltage;
   (b6) making the following measurements while the second terminal is driven by the stimulus and while the first terminal is connected to the reference voltage;
      (b6a) measuring a third voltage at the first terminal of the capacitor;
      (b6b) measuring a fourth voltage at the second terminal of the capacitor,
      (b6c) measuring a second current through the probe; and
   (b7) computing the first and second electromagnetic coupling factors using the first through fourth measured voltages and the first and second measured currents.

3. The method of claim 2 where the stimulus is a voltage source.

4. The method of claim 2 where the stimulus is a current source.

5. The method of claim 2 where the reference voltage is a circuit ground.

6. The method of claim 2 where the reference voltage is a common signal return.

7. The method of claim 1, step (b) further comprising:
   (b1) driving the probe with a stimulus;
   (b2) connecting the second terminal of the capacitor to a reference voltage;
   (b3) making the following measurements while the probe is being driven by the stimulus and while the second terminal is connected to the reference voltage;
      (b3a) measuring a first voltage at the first terminal of the capacitor;
      (b3b) measuring a second voltage at the second terminal of the capacitor;
      (b3c) measuring a first current through the first terminal of the capacitor;
   (b4) connecting the first terminal of the capacitor to the reference voltage;
   (b5) making the following measurements while the first terminal is connected to the reference voltage;
      (b5a) measuring a third voltage at the first terminal of the capacitor;
      (b5b) measuring a fourth voltage at the second terminal of the capacitor;
      (b5c) measuring a second current through the second terminal of the capacitor; and
   (b6) computing the first and second electromagnetic coupling factors using the first through fourth measured voltages and the first and second measured currents.

8. The method of claim 7 where the stimulus is a voltage source.

9. The method of claim 7 where the stimulus is a current source.

10. The method of claim 7 where the reference voltage is a circuit ground.

11. The method of claim 7 where the reference voltage is a common signal return.

* * * * *